Nov. 12, 1968 R. G. SOMMERUD ET AL 3,411,102

AUTOMATIC FREQUENCY CORRECTION FOR PHASE LOCKED OSCILLATOR SYSTEMS

Filed Jan. 16, 1968 5 Sheets-Sheet 1

INVENTORS
ROLF G. SOMMERUD
CHRISTIAN F. HOLMBOE
JAMES F. DE LORME

ATTORNEY

INVENTORS
ROLF G. SOMMERUD
CHRISTIAN F. HOLMBOE
BY JAMES F. DE LORME
ATTORNEY

INVENTORS.
ROLF G. SOMMERUD
CHRISTIAN F. HOLMBOE
JAMES F. DE LORME
BY Leonard Holtz
AGENT INVENTORS.
ROLF G. SOMMERUD
CHRISTIAN F. HOLMBOE
JAMES F. DE LORME
BY Leonard Holtz
AGENT

INVENTORS
ROLF G. SOMMERUD
CHRISTIAN F. HOLMBOE
BY JAMES F. DE LORME
ATTORNEY

United States Patent Office 3,411,102

Patented Nov. 12, 1968

3,411,102

AUTOMATIC FREQUENCY CORRECTION FOR PHASE LOCKED OSCILLATOR SYSTEMS

Rolf Gunnar Sommerud, Bekkestua, and Christian Fredrik Holmboe, Strommen, Norway, and James Francis De Lorme, Irvington, N.J., assignors to International Telephone and Telegraph Corporation, Nutley, N.J., a corporation of Maryland Continuation-in-part of application Ser. No. 573,556, Aug. 19, 1966. This application Jan. 16, 1968, Ser. No. 706,210

11 Claims. (Cl. 331—14)

ABSTRACT OF THE DISCLOSURE

A digital system for automatically maintaining phase lock in a phase locked oscillator loop wherein a digital signal having substantially the same duty cycle as the output waveform from the phase detector is fed to the voltage controlled oscillator when the "reference signal" is interrupted. In this manner, phase lock is maintained without the drift inherent in the known systems which use capacitor storage devices.

This is a continuation-in-part of application Ser. No. 573,556, filed Aug. 19, 1966, now abandoned. This invention relates to phase locked oscillator systems, and more particularly to phase locked oscillator systems which substantially maintain phase lock when the reference signal is interrupted.

Phase locked oscillator loops are well known in the art and are utilized in many control systems, navigation systems, communication systems, and the like. A serious problem arises in these systems when the reference signal to which the variable oscillator in the loop is locked is interrupted for one reason or another. In fact, in many systems the reference signal is deliberately interrupted for short periods of time.

One method for substantially maintaining phase lock during these interruption periods is to place an integrator at the output of the phase detector or at the input of the voltage controlled oscillator in order to maintain the last previous error signal during such interruptions. A drawback of this method is that integrators must have a comparatively long time constant to maintain a small phase error during interruptions. The long time constant will also decrease the effective bandwidth of the voltage control oscillator feedback loop. A short time constant will on the other hand increase the voltage controlled oscillators capturing range and frequency agility. During an interruption with a short time constant the signal on the integrator will decay causing a change in the error voltage fed to the voltage controlled oscillator and, therefore, a possible loss of phase lock.

Another system for substantially maintaining phase lock during reference signal interruptions is illustrated in U.S. Patent No. 3,059,187, issued to R. M. Jaffe. In this system a plurality of harmonically related signals are generated which have predetermined frequency spacings. These signals are applied to the phase detector of the phase locked loop in place of the reference signal when the reference signal is disconnected from the system. The system will then lock on to that particular harmonic frequency which is closest to the reference frequency when it was disconnected. It is recognized that the error in maintaining phase lock in such a system is dependent in part upon the frequency spacings between the signals generated by the harmonic generator. In order to reduce this maximum error, one must generate signals spaced as closely together as possible in the frequency domain, thereby presenting a serious design problem in designing a phase locked loop with the proper selectivity characteristics.

Therefore, the main object of this invention is to provide an improved phase locked oscillator system which will substantially maintain phase lock during interruptions in the reference frequency signal.

A feature of this invention is that a plurality of pulses having substantially the same average energy content as the signal which represents the phase difference between an input signal and a control oscillator output signal is applied to the controlled oscillator when the input signal is interrupted for substantially maintaining phase lock.

According to this invention, a phase locked oscillator system comprises a phase detector, a source of reference frequency signal coupled to said phase detector, a controlled oscillator coupled to said phase detector and first means coupling the output of said phase detector to said controlled oscillator to control the frequency thereof. Further provided is means coupled to said phase detector and to said controlled oscillator for generating a plurality of pulses having substantially the same average energy content as the phase detector output for substantially maintaining phase lock when said reference signal is interrupted.

The above mentioned and other objects of this invention will become apparent by reference to the following description taken in conjunction with the accompanying drawings in which.

The approach taken in the phase locked oscillator system according to this invention, is to "remember" the output of the phase detector and to generate a pulse-type signal having substantially the same energy content. This signal is then fed to the voltage controlled oscillator via a low pass filter in place of said phase detector output when the reference signal is interrupted in order to substantially maintain the oscillator frequency.

Figure 1:
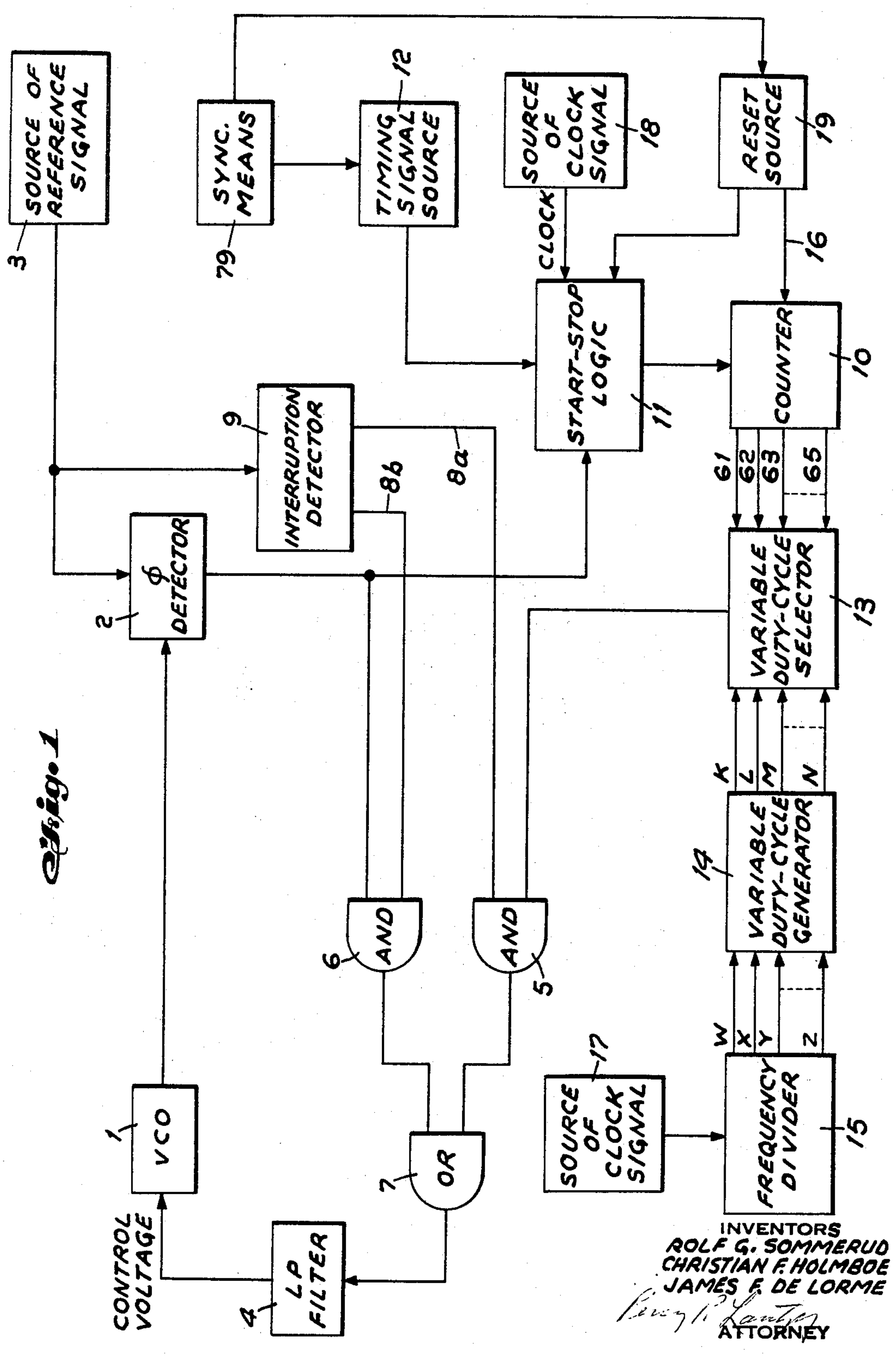
FIGURE 1 is a block diagram of a preferred embodiment of this invention.

Referring now to FIGURE 1, a voltage controlled oscillator 1 is coupled to one input of phase detector 2, a source of reference signal 3 being coupled to another input of phase detector 2. The source of reference signal 3 is also coupled to interruption detector 9. The interruption detector is discussed in detail below with reference to FIGURE 5. The output of phase detector 2 is coupled to an input of AND-gate 6, the other input of AND-gate 6 being coupled to an output of interruption detector 9. The output of AND-gate 6 is coupled to one input of OR-gate 7, the output of OR-gate 7 being coupled to the voltage controlled oscillator 1 via a low pass filter 4.

Figure 3:
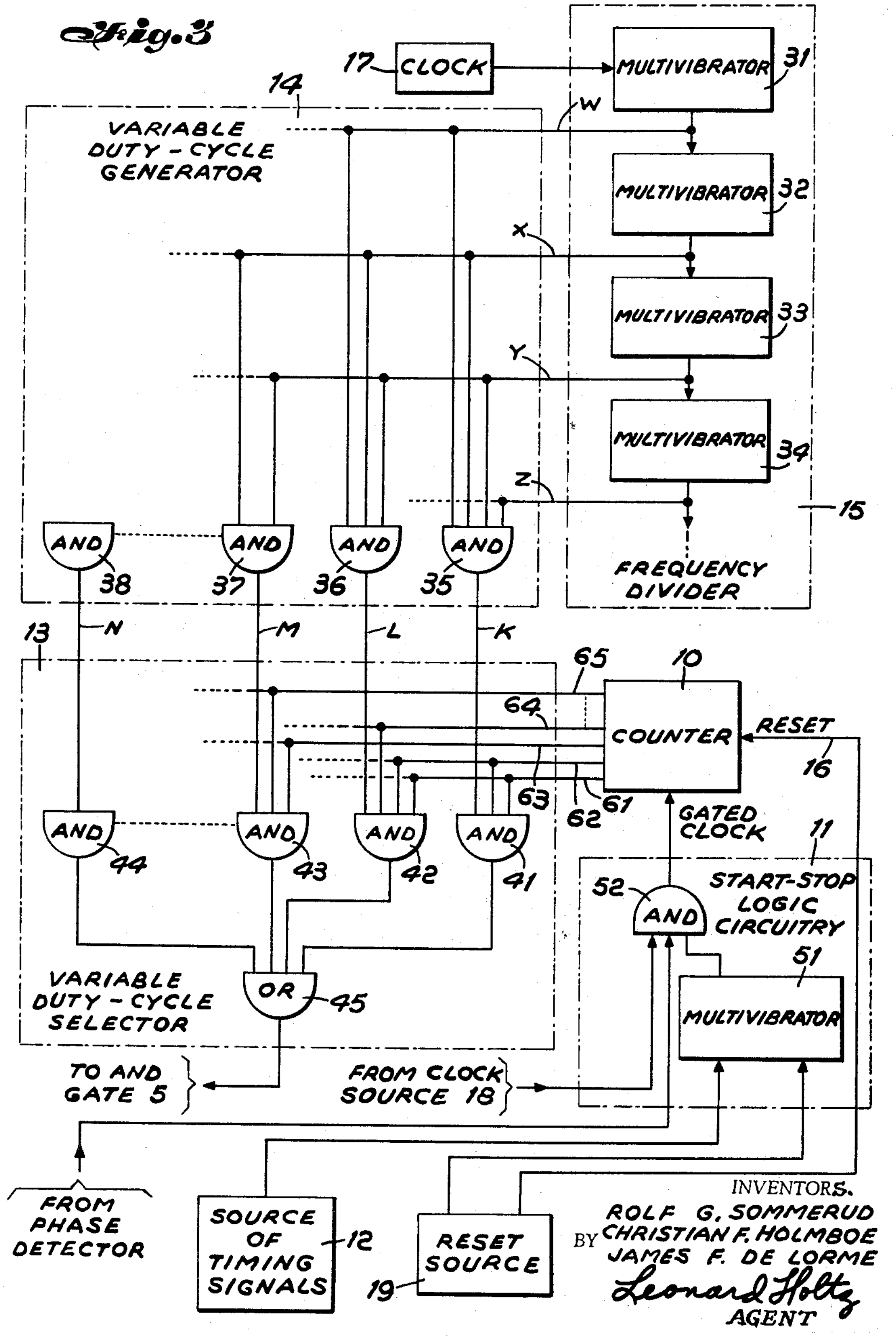
FIGURE 3 is a more detailed block diagram of preferred embodiments of the start-stop logic circuitry, the frequency divider, the variable duty-cycle generator and the variable duty-cycle selector which are generally illustrated in block form in FIGURE 1.

The output of phase detector 2 is further coupled to one input of start-stop logic 11. A detailed block diagram of a particular embodiment of start-stop logic 11 appears in FIGURE 3. Also coupled to start-stop logic 11 is a source of timing signal 12, a source of clock frequency signal 18 and a source of reset signal 19. Reset source 19 is further coupled to counter 10. A synchronization means 79 is coupled to timing signal source 12 and to reset source 19 to synchronize the operations thereof. The synchronization means 79 may be any device well known in the art such as a timer, or the like. Coupled to the output of start-stop logic 11 is counter 10, the outputs of counter 10 being coupled to variable duty-cycle selector 13. Also coupled to variable duty-cycle 13 is variable duty-cycle generator 14. Coupled to the input of variable duty-cycle 14 are the outputs of frequency divider 15 which is fed by source of clock frequency signal 17. It is noted that clock sources 17 and 18 may be combined as one source but are shown here as two separate sources by way of illustration. Detailed block diagrams of the variable duty cycle selector 13, the variable duty-cycle generator 14 and divider 15 are illustrated in FIGURE 3.

Coupled to the inputs of AND-gate 5 are the output of variable duty-cycle selector 13 and an output of interruption detector 9. Note that in this embodiment the two outputs of interruption detector 9 are in inverse of each other. The outputs of AND-gate 5 is coupled to the other input of OR-gate 7. Depending upon whether the reference signal is interrupted or not, OR-gate 7 will feed either the output of the phase detector 2 or the output of the variable duty-cycle selector 13 via one of AND-gates 6 and 5, respectively, to the voltage controlled oscillator 1 via low pass filter 4.

For purposes of explanation, a digital system will be assumed wherein the outputs of the voltage controlled oscillator 1 (FIGURE 2B), the reference signal source 3 (FIGURE 2A), the clock signal source 17 (FIGURE 2F), and the timing signal source 12 (FIGURE 2E) will all be assumed to be digital signals. Also, for the purposes of this explanation, the phase detector 2 merely comprises a bistable multivibrator which is operated by the outputs of the voltage controlled oscillator 1 and the reference signal source 3. Therefore, as illustrated in FIGURE 2C, the output of the phase detector 2 is a digital signal whose "on" time is determined by the phase (or time) difference $\Phi$ between the leading edges of the output of oscillator 1 and of the reference signal. The output signal from the phase detector 2, illustrated in FIGURE 2C, will hereafter be referred to as the error signal. The output from synchronizing means 79 is not shown since it is deemed unnecessary for a proper understanding of the instant invention by one ordinarily skilled in the art.

Figure 2:
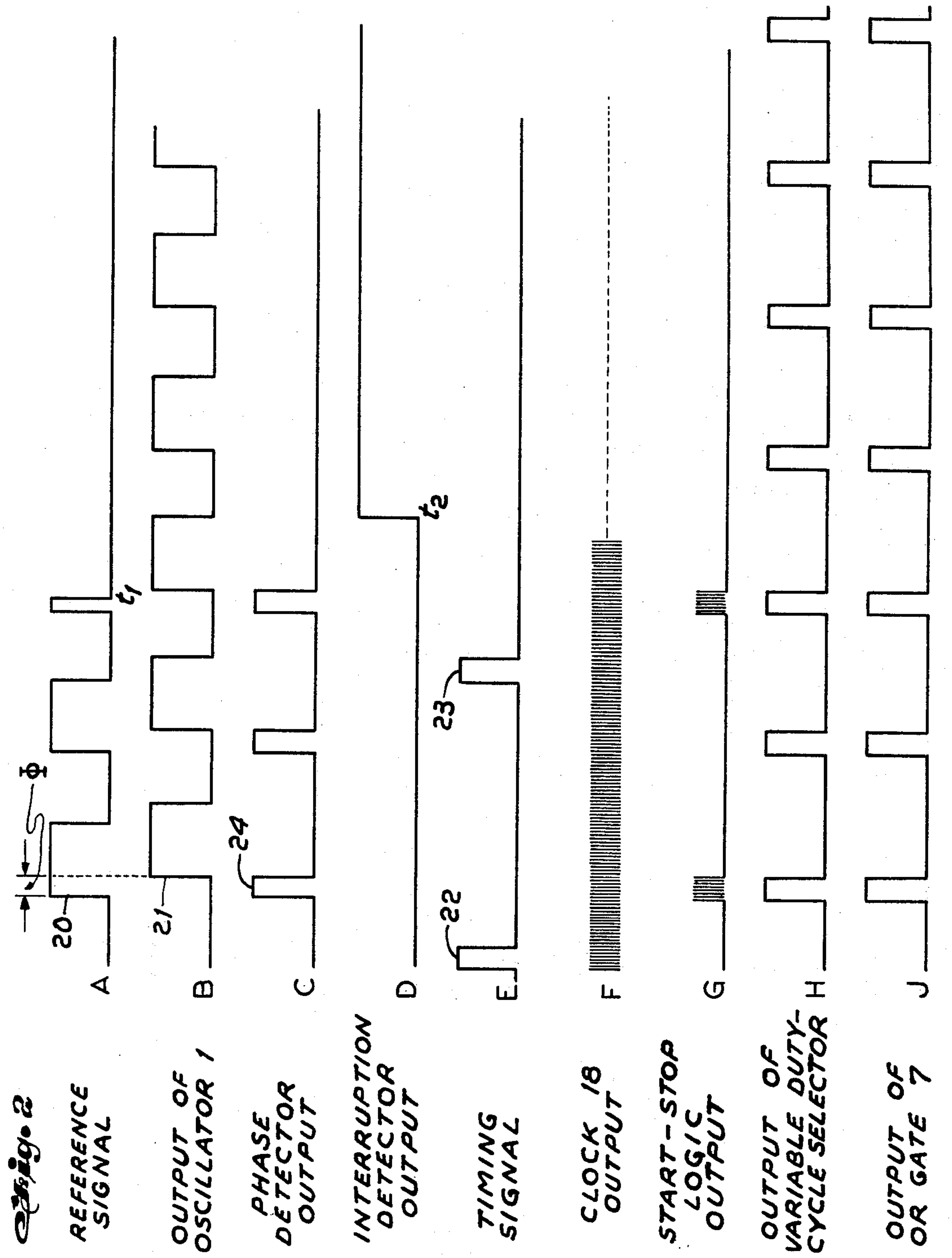
FIGURE 2 is an illustration of significant waveforms taken at various points in the block diagram of FIGURE 1.

Referring to FIGURES 1 and 2, the basic operation of a digital system according to this invention will be described. The output signals from the (reference signal source 3) and the voltage controlled oscillator 1, illustrated in FIGURES 2A and B, respectively, are assumed to be out-of-phase by the amount $\Phi$ as shown in FIGURE 2. Assuming that the phase detector 2 is a bistable multivibrator, the leading edge 20 of the reference signal triggers the phase detector on. The leading edge 21 of the oscillator output subsequently triggers the phase detector off. This waveform appearing at the output of the phase detector 2 is illustrated in FIGURE 2C. Since the reference signal is present during this time, the output **8*a* of the interruption detector 9 which feeds AND-gate 5 is "0." The inverted output 8*b* of interruption detector 9 is a "1" and is applied to one input of AND-gate 6, thereby enabling AND-gate 6. The output of the phase detector which is applied to the other input of AND-gate 6 thus supplies the waveform shown in FIGURE 2C to the low pass filter 4, which provides a control voltage to oscillator 1. This control voltage appearing at the input of oscillator 1** is in the form of a DC voltage at this point. A detailed description of the operation of the standard phase locked loop portion of the system illustrated in FIGURE 1 is not deemed necessary for an understanding of this invention since such phase locked loops are well known in the art and are fully described in the literature.

Figure 5:
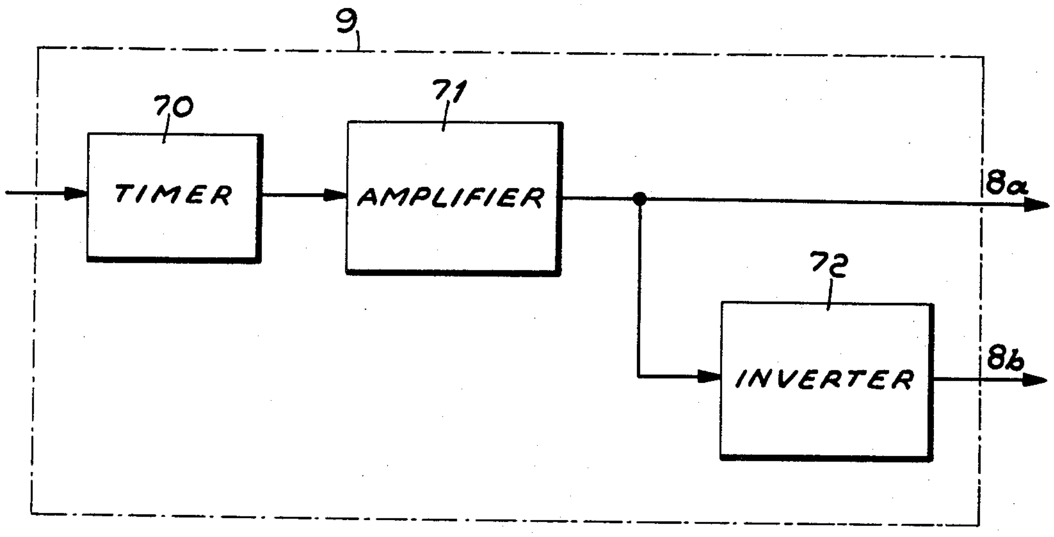
FIGURE 5 is a block diagram of a typical interruption detector for use in the block diagram of FIGURE 1.

One embodiment of the interruption detector 9 (of FIGURE 1) is shown in FIGURE 5. This circuit includes a timer 70 coupled to an amplifier 71. The output of amplifier 71 provides the output **8*a* of interruption detector 9 and is also fed to an inverter 72, the output of which provides the other output 8*b* of interruption detector 9**. The interruption detector of FIGURE 5 "times" the gaps between pulses of the reference signal applied thereto and when the gaps exceed a predetermined value, the timer times out, thereby causing the two outputs of the interruption detector to change polarity and indicate a failure or interruption of the incoming reference signal.

Figure 6:
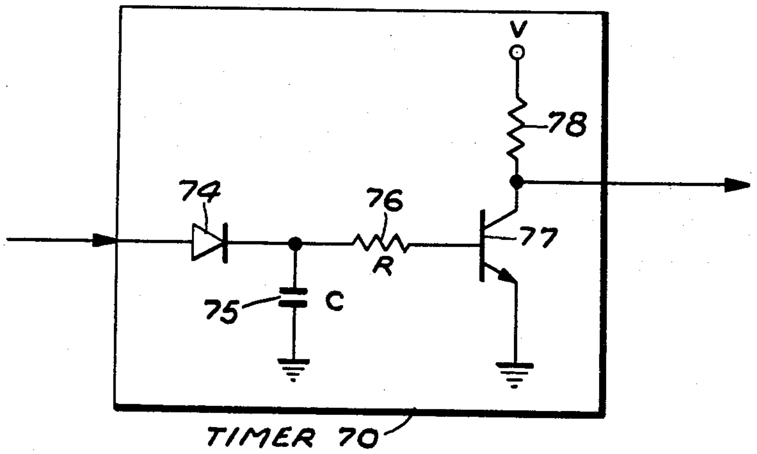
FIGURE 6 is a more detailed circuit diagram of a simple timer for use in the interruption detector of FIGURE 5.

FIGURE 6 shows, in more detail, one type of timer suitable for use in the interruption detector 9 of FIGURE 5. This timer includes a diode 74 coupled to the input terminal thereof and a capacitor 75 of value C coupled between the other end of the diode 74 and ground potential. A resistor 76 of value R couples the junction of the diode 74 and the capacitor 75 to the base electrode of an NPN transistor 77. The emitter electrode of transistor 77 is coupled to ground potential and a resistor 78 couples the collector electrode thereof to voltage source V. When the input signal is positive the capacitor 75 is quickly charged through the forward biased diode 74 and transistor 77 is "on," the voltage at its collector being "0." During gaps in the pulses of the reference signal (the input signal) the capacitor 75 discharges through the resistor 76 and the base emitter path of transistor 77 with a time constant which is substantially equal to RC. If the pulse spacings of the reference signal are proper, the capacitor 75 is recharged before it discharges enough to cause transistor 77 to turn "off." When the input pulse spacings exceed a predetermined value, the predetermined value being a function of RC, the capacitor discharges enough so that transistor 77 is turned "off" and the potential at its collector electrode therefore goes to "1" (which is approximately +V volts). In the embodiment of FIGURE 5, the amplifier 71 "shapes" the output of the timer 70, and, since amplifier 71 inverts the signal, its output (**8*a*) is fed to AND-gate 5 of FIGURE 1. An inverter 72 is supplied to provide the signal which is fed to AND-gate 6**.

It should be clear that other timers for use in interruption detector 9 of FIGURE 1 may be devised by one ordinarily skilled in the art within the scope of this invention. For example, the timer 70 may consist of a counter being fed by a clock generator. A decoder is then utilize to interpret the counter outputs and to feed AND-gates 5 and 6. Also, a circuit such as shown on page 202 of "Electronic Circuit Design Handbook" 1st edition 1965, published by Mactier Publishing Corp., may be adapted for use as an interruption detector which is operable in the system illustrated in FIGURE 1.

It is pointed out here that when the system according to this invention is used in a radio receiver or the like, the interruption detector may merely comprise logical gates which are controlled by the output of the AGC system of the receiver. By monitoring the AGC voltage in a receiver one can detect if the incoming signal has dropped out and operate the gates by means of the AGC voltage level. A further discussion of this type of interruption detector is not given here since it is not deemed necessary for a proper understanding of the instant invention.

The output of the phase detector is also applied to start-stop logic 11 which gates the clock pulses from source 18 to the counter 10. In this particular embodiment, the gating of clock pulses will only take place after a timing signal comprising a pulse 22 (see FIGURE 2E) is received from timing signal source 12. Before a timing signal 22 is received a reset pulse is generated on line 16 by reset source 19 which resets the counter 10 and the start-stop logic 11 to initial positions. The synchronizing means 79 controls these functions. After the receipt of the timing signal 22 the start-stop logic 11 is enabled and upon the appearance of a "1" input from the phase detector the clock pulses will be gated therethrough as illustrated in FIGURE 2G. The start-stop logic 11 is illustrated in more detail in FIGURE 3 and a more detailed description thereof will be given in the discussion of the figure. The counter 10 counts the number of clock pulses gated it to its input (see FIGURE 2G) and the final state thereof indicated the number of clock pulses received. The output signals of counter 10 are therefore indicative of the final state of counter 10. The next time a reset signal and a timing signal are received, i.e., the timing pulse 23 of FIGURE 2E, the same sequence of events is repeated in order to update the outputs of counter 10 in case there has been any change in the relative phase of the reference frequency signal. The reset signal is not illustrated in the figures since it is clear that it must occur before the timing signal and its particular form depends upon the particular circuitry used in the system. Note that the number of clock pulses gated through the start-stop circuit 11 to the counter 10 is proportional to the phase difference between the oscillator output and the reference signal. It is pointed out that counters such as counter 10 are well known in the art and may be designed within the spirit of this invention by one ordinarily skilled in the art.

When the subject system is part of a receiving station for a communications system or the like, the reset signal source 19 and the timing signal source 12 denote portions of the overall system which generates the desired timing signals. These blocks 12 and 19 may be coupled to a master timer or to the VCO 1 to generate signals having the proper timing. The design of the timing signal source 12 and the reset signal source 19 should be clear to one ordinarily skilled in the art. It is deemed unnecessary to provide a further description thereof to enable one to obtain a proper understanding of the instant invention.

In the embodiments of FIGURE 1 a synchronization means 79 is shown controlling timing signal source 12 and reset source 19. As mentioned above, synchronizing means may denote a portion of a receiving system or may be coupled to VCO 1 to provide the proper output signals. Other methods for controlling sources 12 and 19 should be apparent to one ordinarily skilled in the art within the spirit of this invention.

Clock 17 feeds pulses into frequency divider 15, the outputs of which are applied to variable duty-cycle generator 14. In the variable duty-cycle generator 14 a plurality of signals having different duty cycles are generated and are fed to the variable duty-cycle selector 13. The final state of the counter 10 is interpreted by variable duty-cycle selector 13 and the appropriate duty-cycle waveform generated by variable duty-cycle generator 14 is gated through to the input of AND-gate 5. When the output of the interruption detector 9 feeding AND-gate 5 is "0," AND-gate 5 is inhibited and the output of variable duty-cycle selector 13 is ineffective. A more detailed block diagram of the variable duty-cycle generator 14, frequency divider 15, and variable duty-cycle selector 13 appears in FIGURE 3 and a more detailed description thereof will be given in the discussion of that figure.

When the reference signal is interrupted, for example at $t=t_1$, as shown in FIGURE 2A, the output 8 of the interruption detector 9 will go to the "1" level at time $t_2$ as shown in FIGURE 2D. This breaks the normal phase locked loop by inhibiting AND-gate 6 and closes the loop comprising the variable duty-cycle selector 13 by enabling AND-gate 5. Therefore, the error signal reaching the oscillator 1 is no longer developed via the phase detector 2, but is now developed via variable duty-cycle selector 13 and is coupled to the oscillator 1 via AND-gate 5 and OR-gate 7. This is because the output of the counter 10 when the last updating of the duty cycle took place after the receipt of timing signal 23 was proportional to the "on" time of the error signal produced by phase detector 2. Since the basic frequency of the error signal is known, the "on" time of the error signal is also proportional to the duty cycle thereof. The outputs 61–65 of the counter 10 are applied to variable duty-cycle selector 13 to enable it to select the one of the signals generated by variable duty-cycle generator 14 having the closest duty-cycle to that of the error signal (see FIGURES 2H and 2J). The oscillator 1 will now remain substantially locked on to the frequency generated by the reference source 3 at the time the counter output was last undated. When the reference signal reappears, the interruption detector output which is fed to AND-gate 6 will go to "1" and the error voltage will be rerouted from the duty-cycle selector 13 back to the phase detector 2 in order that the oscillator 1 may lock onto the reference signal.

It is noted, that in some cases there may be a minor inaccuracy in the signal which is fed to the low pass filter 4 immediately after the reference signal first drops out. This is due to the time lag (or delay) inherent in the detection of a reference signal drop out by the interruption detector 9. Therefore, the first pulse from the variable duty signal selector 13 which is fed to the low pass filter after the reference signal drops out may be reduced in width or be completely deleted, depending upon the particular time that the reference signal dropped out. This is not detrimental to the system operation since the phase locked loop time constants are slow enough to be substantially unaffected by this minor inaccuracy in just one of the error pulses. The proper error signal will thereafter be fed to the low pass filter 4 without such inaccuracies for the duration of the time that the reference signal remains dropped out or interrupted.

It is also recognized that there will be some error in the system which will depend upon how many different duty-cycle signals are generated in variable duty-cycle generator 14. Obviously, the greater the number of different duty-cycle signals generated therein, the higher will be the accuracy of the system, since one will have a greater number of different signals from which to choose the signal with the duty-cycle closest to the output of the phase detector 2. It is also recognized that the accuracy of the system may be improved by updating the information contained in the counter 10 more often. This may be accomplished by generating timing signals at shorter intervals, in order that the oscillator 1 may lock onto the "lastest" frequency generated by the reference source 3 after the reference signal is interrupted.

It is pointed out here that the frequency of the clock source 17 feeding divider 15 is not critical, the only critical parameter being the duty-cycle, and not the frequency, of the outputs of variable duty-cycle generator 14.

Figure 4:
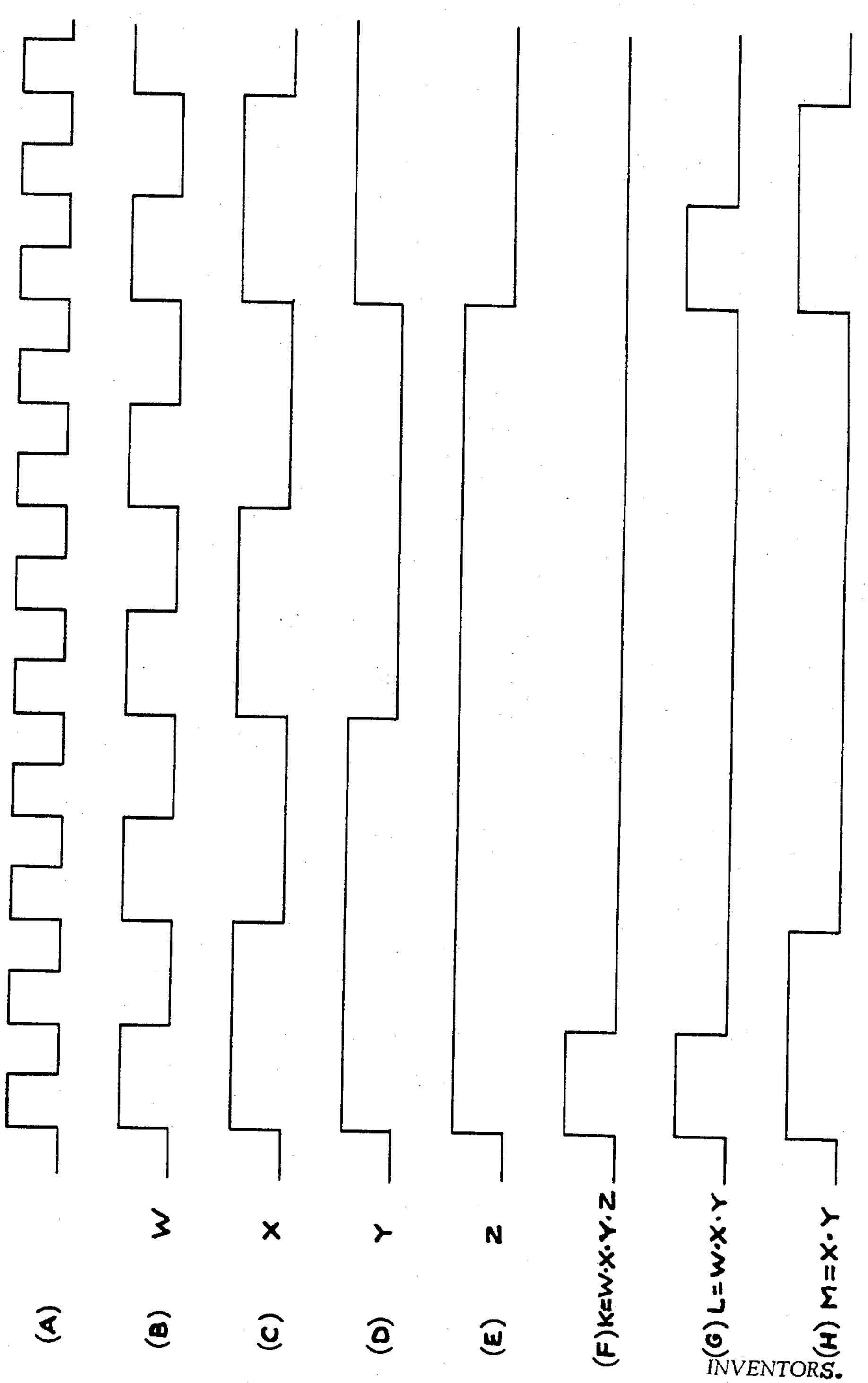
FIGURE 4 is an illustration of pertinent waveforms appearing at various points in the block diagram of FIGURE 3.

Referring to FIGURES 3 and 4, a more detailed description of the frequency divider 15, variable duty-cycle generator 14, variable duty-cycle selector 13 and start-stop logic circuitry 11 is given. The frequency divider 15 is a standard well known binary divider which is well described in the art. For example, such a divider may comprise multivibrators 31, 32, 33 and 34 series coupled as shown in FIGURE 3. Only four such multivibrators are shown but it is noted that more may be used in order to increase the accuracy of the system. The first of these multivibrators 31 is fed with the output of clock source 17 which is illustrated in FIGURE 4A. The time base of the waveforms shown in FIGURE 4 is expanded relative to the time base used in FIGURE 2 in order to more clearly illustrate the concepts involved. For example, note that FIGURE 2F and FIGURE 4A are illustrating the same waveform on different time bases. The outputs W, X, Y and Z of the multivibrators 31–34, respectively, are shown in FIGURES 4B, 4C, 4D and 4E, respectively. These different frequency outputs are combined in variable duty-cycle generator 14 which comprises, for example, AND-gates 35–38, which are coupled to the outputs of divider 15. Again, only four gates are shown for the purposes of illustration. Many more may be utilized in order to provide more signals having different duty-cycles. The various outputs of the frequency divider 15 are combined in these gates 35–38 to produce variable duty-cycle signals such as those illustrated in FIGURES 4G and 4H, which appear on outputs K, L and M, respectively, of variable duty-cycle generator 14. Each of these output signals, it is seen, has a different duty-cycle. It is recognized that many other decoding or combining techniques may be utilized to build a variable duty-cycle generator and that the very simplified embodiment shown in FIGURE 3 is merely by way of example to simply illustrate the concepts involved. The outputs K, L, M and N of generator 14 are then applied to variable duty-cycle selector 13 which comprises, for example, AND-gates 41–44 coupled to an OR-gate 45.

At this point, a brief description of a particular embodiment of the start-stop logic 11 and variable duty-cycle 13, illustrated in detail in FIGURE 3 is in order. The start-stop logic 11 comprises an AND-gate 52 to which is coupled to the outputs of the phase detector 2 and a clock source 18. The source of timing signals 12 is coupled to one input of multivibrator 51, the output of which is coupled to another input of AND-gate 52. A source of reset signal 19 is coupled to the other input of multivibrator 51 for resetting it after the counter is updated.

When a timing signal (pulse 22 of FIGURE 2E, for example) is applied to multivibrator 51, the output thereof which is coupled to AND-gate 52 becomes a logical "1," thereby enabling AND-gate 52. Upon receipt of a pulse from the phase detector 2, such as pulse 24 shown in FIGURE 2C, and AND-gate 52 is further enabled so that the pulses from clock source 18, which are generally illustrated in FIGURE 2F are gated through to counter 10. These gated clock pulses (shown in FIGURE 2G) are gated to counter 10 only during the time that a "1" logic level is applied to AND-gate 52 from phase detector 2 after a timing pulse has been received. Therefore, the number of clock pulses gated to the counter 10 is proportional to the duration of the positive pulse of the error signal and, therefore, to the duty-cycle of the error signal. Thus, the final state of the counter 10 is proportional to the duty-cycle of the error signal.

By virtue of the above sequence of events, counter 10 has various combinations of logical "1's" and logical "0's" appearing at its outputs 61–65, the particular combination of "1's" and "0's" appearing at these outputs being related to the duty-cycle of the error signal. These signals are then applied in predetermined combinations to AND-gates 41–44 which comprise the variable duty-cycle selector 13. The outputs of AND-gates 41–44 are coupled to OR-gate 45 in order to gate the proper output of variable duty-cycle generator 14 through to OR-gate 45, which in turn applies the selected duty-cycle signal to AND-gate 5. When the interruption detector 9 detects that the reference signal has been interrupted, the output of OR-gate 45 is gated to the low pass filter via AND-gate 5 and OR-gate 7.

The next time a timing signal is received, the counter 10 is reset via reset source 19 and the output of the phase detector will again cause a predetermined number of clock pulses from source 17 to be gated into counter 10. This may or may not change the previous count, depending upon whether reference frequency, and, therefore, the duty-cycle of the error voltage had changed since the last check. In this manner the counter 10 is updated so that the oscillator 1 will be caused to lock onto the proper frequency when the reference signal is interrupted. Assuming that the error voltage has changed since the last check, a different combination of "1's" and "0's" will appear at the outputs of counter 10, thereby gating a different one of the outputs of variable duty-cycle generator 14 through to OR-gate 45. It is noted that the particular embodiment of the variable duty-cycle selector 13 illustrated in FIGURE 3 is shown only by way of example and that many other alternate embodiments may be devised by one ordinarily skilled in the art.

It is further noted that the logic circuits in FIGURE 3 are illustrated in abbreviated form for ease of explanation and that they may be varied or expanded within the spirit of this invention by one ordinarily skilled in the art. In particular, it is clear that NAND-gates and NOR-gates and other logic elements may be utilized in place of those illustrated in the figures.

While we have described above the principles of our invention in connection wiht specific apparatus, it is to be clearly understood that this description is made only by way of example and not as a limitation to the scope of our invention as set forth in the accompanying claims.

We claim:

1. A phase locked oscillator system comprising:

a source of reference frequency signal;

a voltage controlled oscillator;

a phase detector coupled to said source of reference signal and to said voltage controlled oscillator for providing a first plurality of pulses having a duty cycle which varies according to the relative phase difference between said reference frequency signal and the output of said voltage controlled oscillator;

first means coupling the output of said phase detector to said voltage controlled oscillator to control the frequency thereof; and means coupled to said phase detector and to said voltage controlled oscillator for generating a second plurality of pulses having substantially the same average energy content as said first plurality of pulses for substantially maintaining phase lock when said reference signal is interrupted.

2. A phase locked oscillator system according to claim 1 wherein said first plurality of pulses has a duty cycle which varies proportionally to the relative phase difference between said reference signal and said voltage controlled oscillator output.

3. A phase locked oscillator system according to claim 1 further comprising a low pass filter coupled between said voltage controlled oscillator and said first coupling means.

4. A phase locked oscillator system according to claim 1 wherein said first coupling means comprises switching means for selectively coupling said phase detector and said generating means to said voltage control oscillator.

5. A phase locked oscillator system according to claim 4 further comprising an interruption detector coupled to said source of reference signal and to said switching means for causing said switching means to couple the output of said generating means to said voltage controlled oscillator in place of the output of said phase detector upon the interruption of said reference signal.

6. A phase locked oscillator system according to claim 1 wherein said second plurality of pulses has substantially the same duty cycle as said first plurality of pulses.

7. A phase locked oscillator system according to claim 6 wherein said generating means includes means coupled to said phase detector for storing a signal proportional to the duty cycle of said first plurality of pulses.

8. A phase locked oscillator system according to claim 7 further comprising a source of clock signal and wherein said means for storing includes:

first gating means coupled to said clock source and to said phase detector; and counting means coupled to said first gating means for counting the number of clock pulses generated by said clock source during the "on" time of the phase detector output signal, the number of clock pulses gated to said counter being proportional to the duty cycle of said phase detector output.

9. A phase locked oscillator system according to claim 8 wherein said generating means further includes:

a frequency divider coupled to said source of clock signal;

second gating means coupled to said frequency divider to provide a plurality of different duty cycle output signals; and third gating means coupled to said counter and to said second gating means for selecting the output signal from said second gating means having a duty cycle which is substantially the same as the duty cycle of said first plurality of pulses.

10. A phase locked oscillator system according to claim 9 further comprising:

a source of timing signal; and means coupling said source of timing signals to said generating means for causing said clock signal to be gated to said counter at predetermined times.

11. A phase locked oscillator system according to claim 5 wherein said switching means includes:

a first AND-gate coupled to said phase detector and to said interruption detector;

a second AND-gate coupled to said generating means and to said interruption detector; and an OR-gate coupling the outputs of said AND-gates to said voltage controlled oscillator.

No references cited.

JOHN KOMINSKI, *Primary Examiner.*